(12) United States Patent
Sekine et al.

(10) Patent No.: US 7,202,103 B2
(45) Date of Patent: Apr. 10, 2007

(54) OVERLAPPED COLOR FILTER FABRICATION TECHNIQUE

(75) Inventors: Yasuhiro Sekine, Kanagawa (JP); Shigeki Mori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/280,323

(22) Filed: Nov. 17, 2005

(65) Prior Publication Data

US 2006/0076591 A1 Apr. 13, 2006

Related U.S. Application Data

(62) Division of application No. 10/676,085, filed on Oct. 2, 2003, now abandoned.

(30) Foreign Application Priority Data

Oct. 9, 2002 (JP) .............................. 2002-096491

(51) Int. Cl.
*H01L 21/00* (2006.01)
*G03F 7/00* (2006.01)

(52) U.S. Cl. ............................. 438/70; 430/7; 430/293

(58) Field of Classification Search .................... 430/7, 430/293; 438/70
See application file for complete search history.

(56) References Cited

U.S. PATENT DOCUMENTS

| 5,093,738 A | 3/1992 | Watanabe et al. ............. 359/68 |
| 5,561,317 A | 10/1996 | Momma et al. ............. 257/620 |
| 5,568,293 A | 10/1996 | Takao et al. ................... 356/68 |
| 5,731,131 A | 3/1998 | Momma et al. ............. 430/311 |
| 6,630,722 B1 | 10/2003 | Aoki .......................... 257/435 |
| 2002/0045111 A1* | 4/2002 | Machiguchi et al. .......... 430/7 |

FOREIGN PATENT DOCUMENTS

| JP | 05-006849 | 1/1998 |
| JP | 10/209410 | 8/1998 |

* cited by examiner

*Primary Examiner*—W. David Coleman
(74) *Attorney, Agent, or Firm*—Fitzpatrick, Cella, Harper & Scinto

(57) ABSTRACT

A solid state image pickup element which can exponentially reduce the in-plane photoelectric conversion portion characteristic distribution created in forming color filters by a common photolithography technique and which, when color filters are formed by split exposure, can reduce image non-uniformity between exposure regions in a picked-up image, and a method of manufacturing the same. The method includes: applying negative type color resist for forming first color filters onto an entire surface of a given film; forming the first color filters by irradiation of given portions with exposure light and subsequent development; applying negative type color resist for forming second color filters onto the entire surface of the first color filters while covering the first color filters; and forming the second color filters by irradiating an area smaller than a region that is surrounded by the first color filters with exposure light and subsequent development.

5 Claims, 10 Drawing Sheets

| 1st EXPOSURE REGION | 2nd EXPOSURE REGION |

1st EXPOSURE REGION | 2nd EXPOSURE REGION

OVERLAPPED COLOR FILTER FABRICATION TECHNIQUE

CROSS-REFERENCE TO RELATED APPLICATION

This application is a divisional of U.S. patent application Ser. No. 10/676,085, filed Oct. 2, 2003, now abandoned the entire disclosure of which is incorporated herein by reference.

BACKGROUND OF THE INVENTION

1. Field of the Invention

The present invention relates to a solid state image pickup element having a color filter for picking up a color image, and to a method of manufacturing a solid state image pickup element.

2. Related Background Art

FIG. 8 shows one of the structures, which have been known, as solid state image pickup elements, for use in color video cameras and color still cameras.

FIG. 8 is a side sectional view showing the structure of a conventional solid state image pickup element.

The solid state image pickup element shown in FIG. 8 has, in the vicinity of a surface of a semiconductor substrate 100, a photoelectric conversion portion 110 which generates signal charges according to the amount of incident light. The photoelectric conversion portion 110 is provided in each of pixels that are arranged to form a lattice pattern.

The pixels each have a driver circuit for generating a pixel signal in accordance with a signal charge that is generated in the photoelectric conversion portion 110, and for sending the pixel signal to a horizontal scanning circuit (not shown in the drawing) in response to a control signal sent from a vertical scanning circuit (not shown in the drawing) that is provided on an edge of the solid state photoelectric conversion element.

As shown in FIG. 8, gate electrodes 109 of transistors that constitute the above driver circuit are formed on the semiconductor substrate 100. On the gate electrodes 109, wiring layers are formed to suit the circuit structure of the driver circuit. In the structural example shown in FIG. 8, two wiring layers 105 and 107 are formed. Diffusion layers (not shown) which serve as sources and drains of the transistors are formed on portions of the semiconductor substrate that are under the gate electrodes.

Wires patterned to have a desired shape are formed in the wiring layers using aluminum (Al) or the like. Interlayer insulating films 106 and 108 formed from, for example, $SiO_2$, are interposed between the wiring layers for insulation.

A first planarization film 104 is formed from, for example, acrylic resin, on the topmost wiring layer 105, covering the wires of the wiring layer 105. Provided on the first planarization film 104 are color filters 103 for splitting incident light in accordance with the color of a pixel. The color filters 103 are classified into three types by their colors (three primary colors of light): red (R) color filters formed from photo resist that contains a red pigment, green (G) color filters formed from photo resist that contains a green pigment, and blue (B) color filters formed from photo resist that contains a blue pigment. Each pixel is covered with one of the three types of color filters.

On the color filters 103, a light-transmissive second planarization film 102 is formed and microlenses 101 which are condensers for collecting incident light in the photoelectric conversion portion 110 are formed on the second planarization film 102.

FIGS. 9A to 9D are side sectional views illustrating a procedure of forming the conventional color filters that are shown in FIG. 8.

To form the color filters shown in FIG. 8, first, negative color resist with, for example, a green (G) pigment dispersed therein is applied to a surface of the first planarization film 104. Then a mask which blocks light except where green color filters (hereinafter referred to as G filters) are to be formed is placed for irradiation with ultraviolet rays having a wavelength of, for example, 365 nm, and for subsequent development. Thus G filters 103G are formed on the first planarization film as shown in FIG. 9A. The pattern of the G filters 103G measures 9.0 µm at the bottom portion (on the side of the first planarization film 104).

Next, as shown in FIG. 9B, negative color resist 103A with a red (R) pigment dispersed therein is applied to the entire top surface of the first planarization film 104 while covering the G filters 103G. Then a mask which blocks light except where red color filters (hereinafter referred to as R filters) are to be formed is placed for irradiation with ultraviolet rays having a wavelength of, for example, 365 nm.

At this point, in a conventional method of manufacturing a solid state image pickup element, a mask having a transmissive portion with a width of 9.0 µm, which is equal to the width of a region surrounded by the G filters 103G, is used in the ultraviolet irradiation (see FIG. 9B) and subsequent development to form an R filter 103R. In this case, the R filter 103R rises at its edges where the R filter meets the G filters 103G as shown in FIG. 9C. Furthermore, as the ultraviolet irradiation energy is increased, the edges of the R filter 103R climb over the edges of the G filters 103G as shown in FIG. 9D. In some conventional solid state image pickup element manufacturing methods, a mask having a transmissive portion that is slightly narrower than the width of the region surrounded by the G filters is used in ultraviolet irradiation to form the R filter 103R.

Details about how other components than the color filters are manufactured are omitted from the description here since they are irrelevant to characteristics of the present invention. Any known manufacture methods can be used to form other components than color filters as long as the optimal configuration is obtained for each of the other components.

In a solid state image pickup element having a large chip size, an image pickup region including the above vertical scanning circuit and horizontal scanning circuit is larger than the range that can be exposed to light in one shot of an exposure device (field size). Therefore, a split exposure method is employed in which the image pickup region is divided into plural exposure regions and the patterns obtained by the division are patched together to form a desired image pickup region. This method is described in JP 05-6849 A, for example.

Recent solid state image pickup elements suffer from various kinds of production fluctuation (such as mask size differences, microlens distortion components, exposure light distribution in one shot, mask alignment precision, and changes with time of resist characteristics) due to the increased level of pixel integration. Such production fluctuation causes fluctuation in size and shape of color filters or mispositioning of color filters, with the result that adjacent color filters overlap each other or a void is created between adjacent color filters.

In the solid state image pickup element manufacturing method described above, corners of the color filters are rounded because of lowering of the resolution of the exposure device, and a void where no color filters are formed is also created in such corners. Adjacent color filters overlap each other also when the energy of ultraviolet irradiation used in exposure of color resist is larger than necessary as described above and when the distance between adjacent color filters actually formed is shorter than designed. An example of eliminating such color filter overlapping and filterless void is disclosed in JP 10-209410 A. According to the method disclosed in this publication, a void between adjacent color filters is eliminated by forming three types of color filters on top of one another and then removing the upper layer color filters until the lowermost color filter is exposed.

As mentioned above, photolithography is usually employed in manufacturing color filters of solid state image pickup elements. In recent solid state image pickup elements where the pixel width is on the order of a few micron meters, a reduction projection exposure device called a stepper is also used to expose patterns of color filters to light in order to accurately form such small pixels.

If there is fluctuation in production process or mispositioning of a mask in forming color filters, the size and position of the color filters are varied depending on the degree of fluctuation. As a result, the shape and size of the color filters, the width of a void between color filters, and the color filter overlapping amount are varied from one exposure shot to another. Even when a mask having a transmissive portion that is narrower than the width of a region surrounded by G filters is used in the above ultraviolet irradiation to form an R filter, the size and position of the R filter are varied due to fluctuation in production process and mispositioning of masks. Accordingly, the width of a void between color filters and the color filter overlapping amount change so as to form distributions throughout the exposure shot plane, or are varied from one exposure shot to another.

A common solid state image pickup element has a chip size smaller than the field size of an exposure device and therefore a color filter pattern is formed in one exposure operation. In this case, if there are a void between color filters and overlapping of color filters as described above, the void width and the overlapping amount change continuously and two-dimensionally throughout the chip plane. Therefore, the amount of light that enters the photoelectric conversion portion changes in a manner that forms a two-dimensional distribution in the image pickup region. This means that a pixel signal outputted contains a shading component and a color mixture component corresponding to the void width and the overlapping amount, thereby causing degradation of a picked-up image.

In a solid state image pickup element formed by the above-described split exposure method, the size and position of color filters are varied from one exposure region obtained by the division to another exposure region. Therefore, it is very difficult to give color filters of different exposure regions the same size as well as to align a color filter of one exposure region identically to a color filter of another exposure region.

Light from an image pickup object enters a microlens formed on a surface of a solid state image pickup element through a light path indicated by a or b in FIG. 10, for example. Here, a ray a is transmitted through the microlens, a first planarization layer, a second planarization layer, a color filter, and several interlayer insulating films to reach a photoelectric conversion portion. On the other hand, a ray b enters from the interface between pixels and, after being scattered, reflected, refracted, diffracted and the like in the interface between color filters and in wiring layers, some components of the ray b reach the photoelectric conversion portion.

When there is a void in the interface between color filters, the absolute amount of incident light is about three times larger than when the interface has no void. Accordingly, if the void width varies, the amount of light that reaches the photoelectric conversion portion is varied by scattering, reflection, refraction, diffraction and the like. Furthermore, overlapping of adjacent color filters and a void between adjacent color filters give the second planarization film formed on the color filters insufficient levelness, and surface irregularities are created in the second planarization film above the color filter overlapping portion and the color filter void portion.

For instance, a concave portion in the second planarization film above the color filter void portion acts like a lens to disperse incident light as shown in FIG. 11A. As a result, dispersed light reaches the photoelectric conversion portion through color filters and causes fluctuation in amount of incident light among pixels.

In the color filter overlapping portion, on the other hand, light passes through the combined thicknesses of two color filters and is attenuated in the process before reaching the photoelectric conversion portion, resulting in fluctuation in amount of incident light among pixels. In addition, color is mixed as light passes through the color filter overlapping portion since adjacent color filters usually have different colors, and light of mixed colors reaches the photoelectric conversion portion. Furthermore, a convex portion formed in the second planarization film above the color filter overlapping portion as shown in FIG. 11B causes a change in amount of light that enters the photoelectric conversion portion indirectly through refraction of light. Therefore, despite equal conditions under which light from an image pickup object enters pixels, the absolute amount of light that reaches the photoelectric conversion portion varies from one pixel to another.

When color filters are formed by the above-described split exposure method, the color filter overlapping amount and the void width are varied among exposure regions divided as shown in FIG. 12 or FIG. 13 (a first exposure region and a second exposure region). This fact is reflected on difference in pixel signal voltage value (light detection sensitivity), which is determined by the amount of incident light, between the exposure regions and the difference is erroneously recognized as a difference in brightness of the picked-up image. As a result, when a solid state image pickup element formed by the split exposure method is used in picking up an image, visible streaks of image non-uniformity are found in portions of the picked-up image that correspond to interfaces between divided exposure regions.

Overlapping of color filters and a void between color filters are caused mainly by the exposure process as described above. Therefore, the overlapping amount and the void width can be reduced by various measures such as raising the precision of the size of masks used in exposure to light, correcting mispositioning of masks, correcting the exposure energy difference between exposure regions, and uniformizing characteristics of resist for forming color filters. However, it is impossible to reduce process fluctuation in an exposure region, namely, in-plane distribution, to nil. In addition, exposure process differences between exposure regions cannot be eradicated as long as the split exposure method above is employed. It has therefore been difficult in prior art to restrain within a certain range the difference in light detection sensitivity between exposure regions.

SUMMARY OF THE INVENTION

The present invention has been made to solve the above-described problems of prior art, and an object of the present invention is therefore to provide a solid state image pickup element manufacturing method and a solid state image pickup element which can exponentially reduce the in-plane photoelectric conversion portion characteristic distribution that is created in forming color filters by a common photolithography technique and which, when color filters are formed by split exposure, can reduce image non-uniformity between exposure regions in a picked-up image.

To achieve the above-described object, the present invention provides a method of manufacturing a solid state image pickup element with negative type color filters of plural colors formed of color resist, including:

applying color resist for forming first color filters onto an entire surface of a given film;

forming the first color filters by irradiation of given portions with exposure light and by subsequent development;

applying color resist for forming second color filters to the entire surface of the first color filters while covering the first color filters; and forming the second color filters by irradiation of an area smaller than a region that is surrounded by the first color filters with exposure light and by subsequent development.

In the solid state image pickup element manufacturing method described above, exposure conditions under which the second color filters are exposed to light are altered from standard exposure conditions to thereby widen a pattern of the second color filters. Accordingly, a color filter can be formed stably with its size and position regulated by the sizes of adjacent color filters and no void is created even when there is fluctuation in production process and alignment fluctuation.

DESCRIPTION OF THE PREFERRED EMBODIMENTS

Referring to the accompanying drawings, the present invention is described below.

First Embodiment

FIGS. 1A to 1E are sectional views showing a manufacture procedure in a first embodiment of a solid state image pickup element of the present invention.

Figure 8:
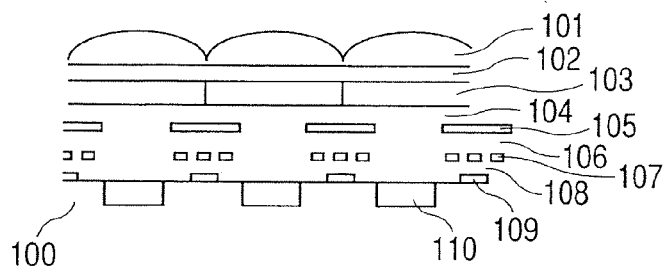
FIG. 8 is a side sectional view showing the structure of a conventional solid state image pickup element.
Figure 9A:
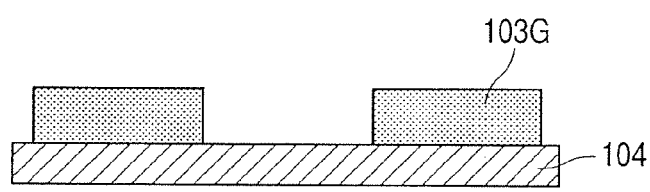
FIGS. 9A, 9B, 9C, and 9D are side sectional views illustrating a procedure of forming conventional color filters that are shown in FIG. 8.
Figure 9B:
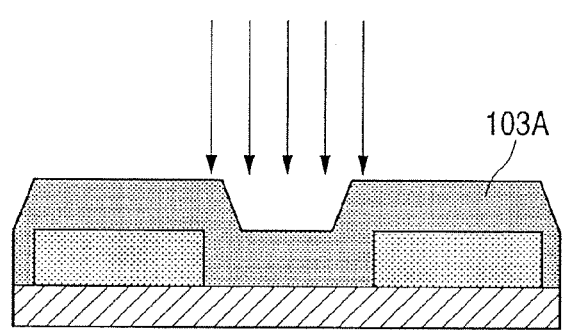
Figure 9C:
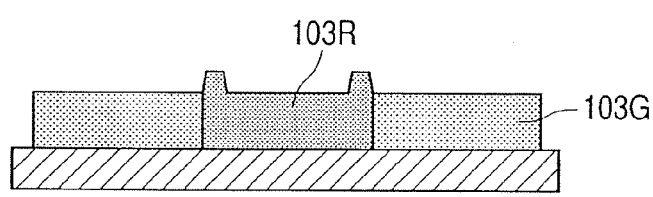
Figure 9D:
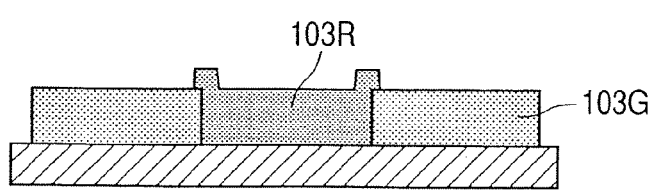
Figure 10:
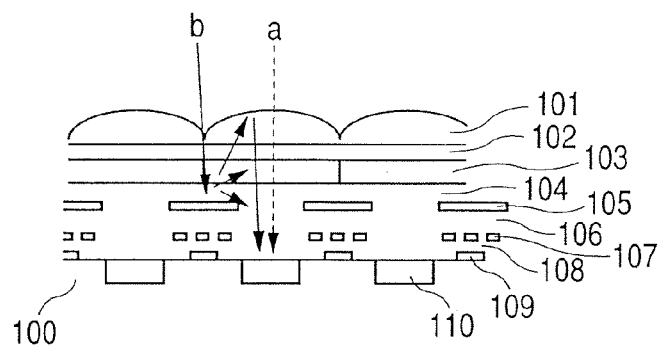
FIG. 10 is a side sectional view showing light path examples for light which enters a solid state image pickup element from an image pickup object.
Figure 11A:
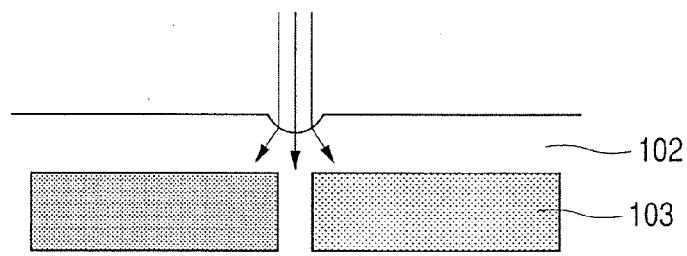
FIGS. 11A and 11B are diagrams of a relevant part enlarged to show mispositioning of color filters and an example of the shape of a first planarization film in the conventional solid state image pickup element shown in FIGS. 9A 9B, 9C and 9D.
Figure 11B:
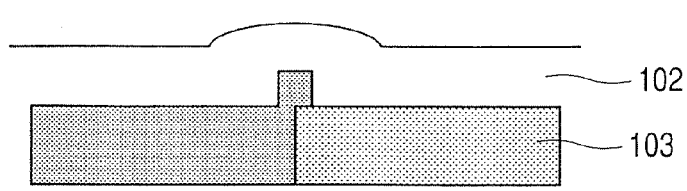
Figure 12:
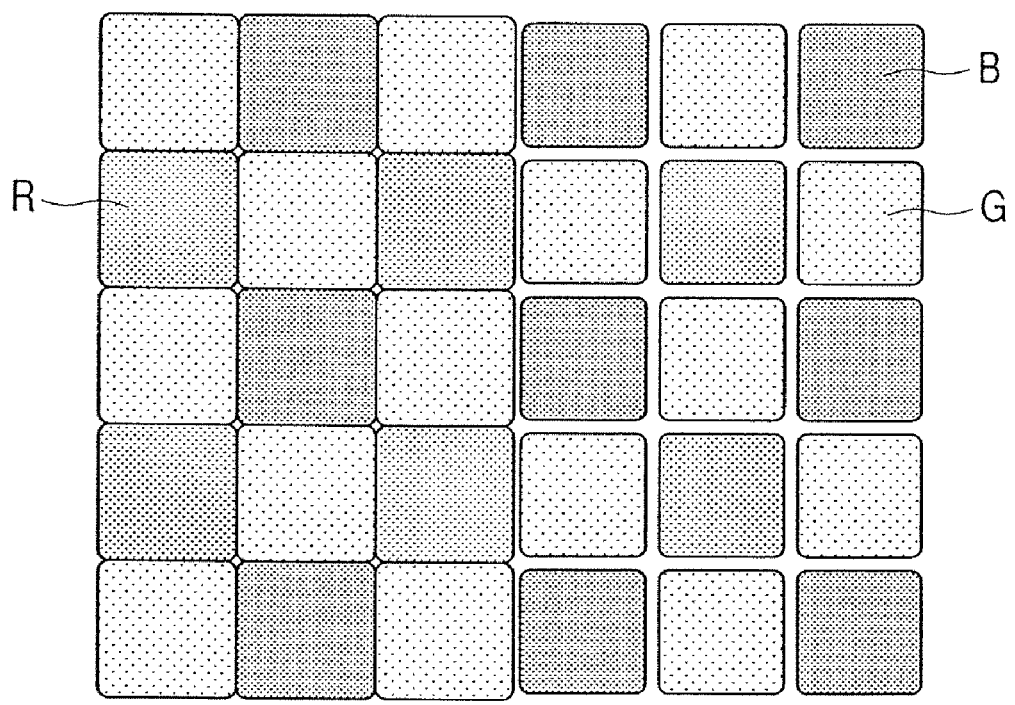
FIG. 12 is a top view showing the positional relation between conventional color filters formed by split exposure.
Figure 12:
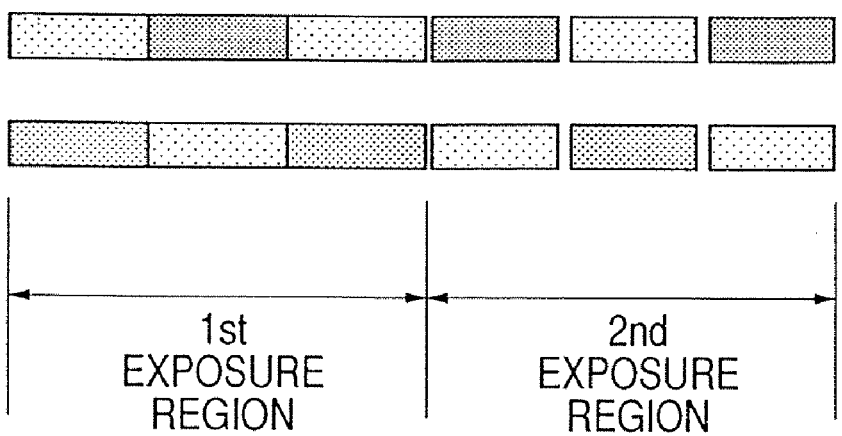
Figure 13:
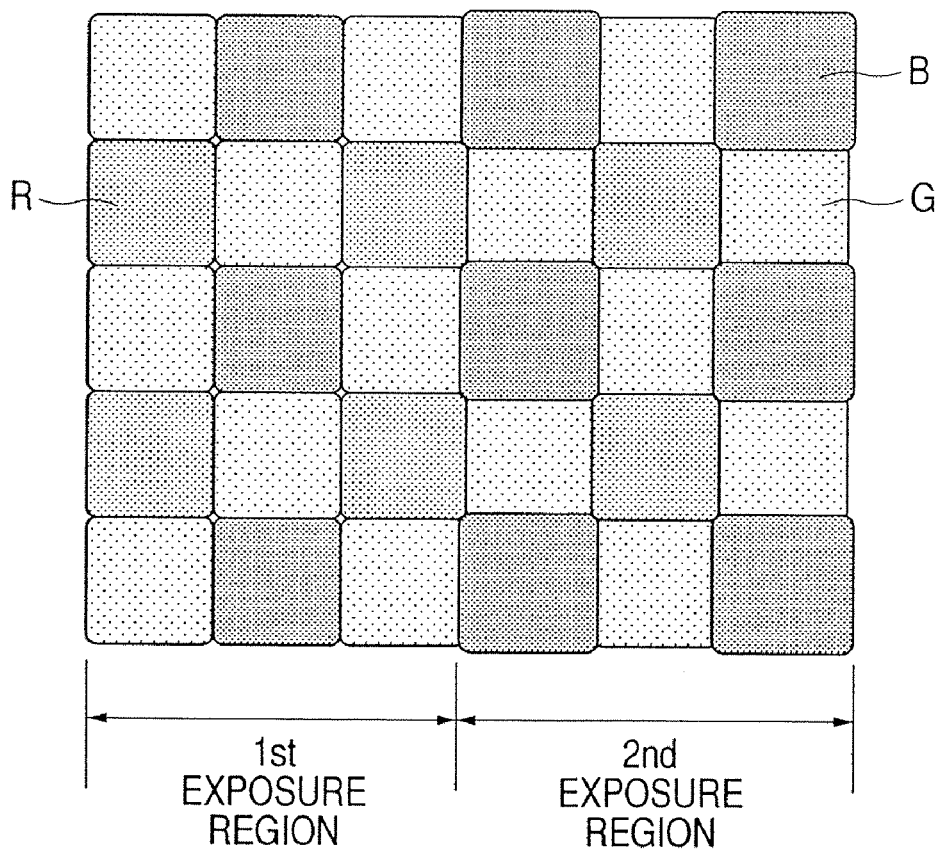
FIG. 13 is a top view showing the positional relation between conventional color filters formed by split exposure.

The solid state image pickup element shown in FIGS. 1A to 1E has a pixel pitch of 9 μm and color filters are arranged in accordance with the Bayer pattern similar to the conventional solid state image pickup elements shown in FIGS. 12 and 13. The structure of this solid state image pickup element is identical with that of the conventional solid state image pickup element shown in FIG. 8 except the shapes of the color filters, and therefore a description of the identical part is omitted here.

Figure 1A:
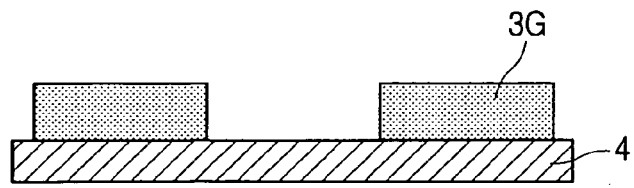
FIGS. 1A, 1B, 1C, 1D, and 1E are sectional views showing a manufacture procedure in a first embodiment of a solid state image pickup element of the present invention.

In a solid state image pickup element manufacturing method of this embodiment, the first step is to apply negative color resist with, for example, a green (G) pigment dispersed therein to a surface of a first planarization film 4 as shown in FIG. 1A. Then a mask which blocks light except where G filters are to be formed is placed for irradiation with ultraviolet rays having a wavelength of, for example, 365 nm, and for subsequent development. Thus G filters 3G are formed on the first planarization film 4. The pattern of the G filters 3G in this embodiment measures 9.0 μm at the bottom portion (on the first planarization film side).

Figure 1B:
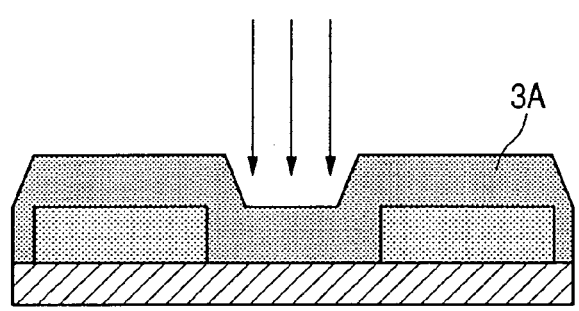

Next, as shown in FIG. 1B, negative color resist 3A with a red (R) pigment dispersed therein is applied to the entire top surface of the first planarization film 4 while covering the G filters 3G. Then a mask which blocks light except where R filters (each denoted by 3R) are to be formed is placed for irradiation with ultraviolet rays having a wavelength of, for example, 365 nm.

The mask used in this ultraviolet irradiation has a 8.5 μm square transmissive portion positioned, for example, 0.25 μm away from the edges of a region surrounded by the G filters 3G as shown in FIG. 1B where there is no fear of the R filter 3R overlapping the G filters 3G even when the mask is mispositioned.

Figure 1C:
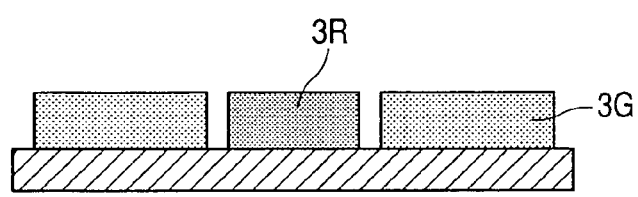
Figure 1D:
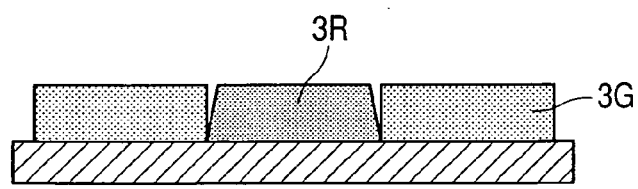
Figure 1E:
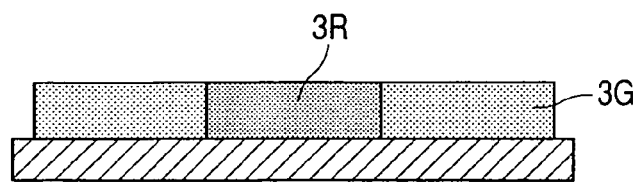

If the ultraviolet irradiation energy is small during formation of the R filter 3R, the R filter 3R after development is isolated like an island in the region surrounded by the G filters 3G as shown in FIG. 1C. If the ultraviolet irradiation energy is increased (over-exposure), the R filter 3R is gradually widened in response to an increase in irradiation energy until the R filter 3R comes into contact with the edges of the G filters 3G as shown in FIG. 1D. As the ultraviolet irradiation energy is further increased, the R filter 3R is increased in size until the region surrounded by the G filters 3G is filled with the R filter 3R. The R filter 3R is almost completely embedded in the region surrounded by the G filters 3G as shown in FIG. 1E if the irradiation energy is optimized.

Once the R filter 3R comes into contact with the edges of its adjacent G filters 3G, an increase in size of the R filter is restrained irrespective of an increase in irradiation energy. Therefore, the R filter 3R does not climb over the G filters 3G. This shows that the size of the R filter 3R is defined by the shape and size of the G filters 3G.

Therefore, according to the solid state image pickup element manufacturing method of this embodiment, a color filter can be formed stably with its size and position regulated by the sizes of adjacent color filters previously formed and no void is created even when there are fluctuation in production process and alignment fluctuation.

Figure 2:
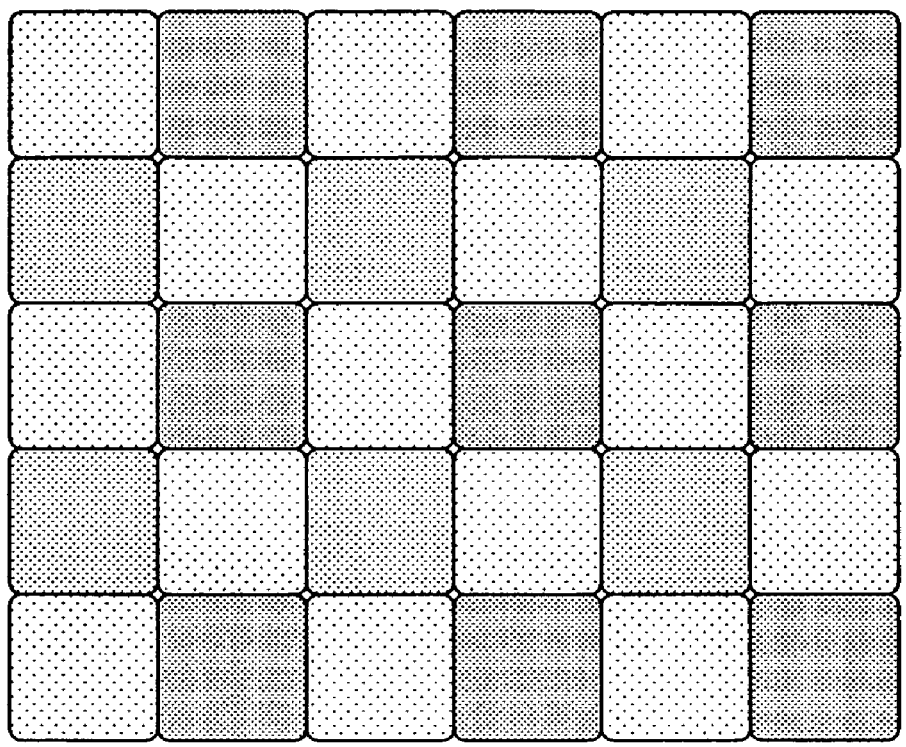
FIG. 2 is a top-view showing the positional relation between color filters that are formed by split exposure in accordance with the present invention.
Figure 2:
Figure 2:
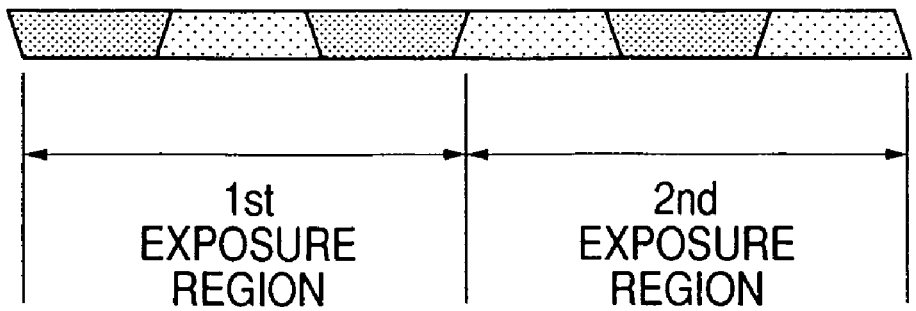

If this embodiment is applied to a process of manufacturing color filters of a solid state image pickup element by split exposure, voids between adjacent color filters in one exposure region can be kept approximately identical to voids in the other exposure region (a first exposure region and a second exposure region) as shown in FIG. 2 even when the process fluctuates from one exposure shot to another. Therefore, image non-uniformity between exposure regions in a picked-up image can be reduced.

An image has been picked up using the solid state image pickup element of this embodiment and inspected to find no visible streaks of image non-uniformity in portions of the picked-up image that correspond to interfaces of exposure regions even though split exposure has been employed in the color filter manufacturing process.

Second Embodiment

FIGS. 3A to 3E are sectional views showing a manufacture procedure in a second embodiment of a solid state image pickup element of the present invention.

The solid state image pickup element shown in FIGS. 3A to 3E, similarly to the first embodiment, has a pixel pitch of 9 μm and color filters are arranged in accordance with the Bayer pattern.

Figure 3A:
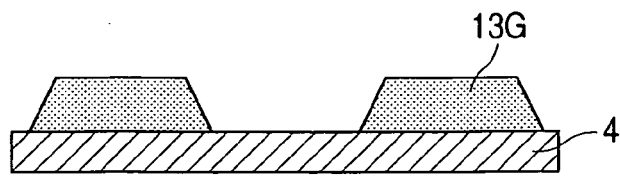
FIGS. 3A, 3B, 3C, 3D, and 3E are sectional views showing a manufacture procedure in a second embodiment of a solid state image pickup element of the present invention.

In a solid state image pickup element manufacturing method of the second embodiment, the first step is to apply negative color resist with, for example, a green (G) pigment dispersed therein to a surface of a first planarization film 4 as shown in FIG. 3A. Then a mask which blocks light except where G filters 13G are to be formed is placed for irradiation with ultraviolet rays having a wavelength of, for example, 365 nm, and for subsequent development. Thus G filters 13G are formed on the first planarization film 4.

In this embodiment, the G filters 13G are exposed to light through ultraviolet irradiation of varying intensity. To elaborate, the exposure contrast is lowered at edges of a region to be exposed to light, so that the pattern of the G filters 13G measures 9.1 μm at the bottom portion (on the first planarization film side). In this case, the edges of the G filters 13G are tapered as shown in FIG. 3A. The exposure contrast at the edges of the exposure region can be lowered by shifting the focus of exposure light.

Figure 3B:
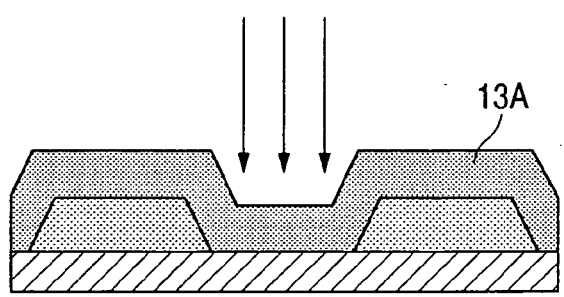

Next, as shown in FIG. 3B, negative color resist 13A with a red (R) pigment dispersed therein is applied to the entire top surface of the first planarization film 4 while covering the G filters 13G. Then a mask which blocks light except where R filters (each denoted by 13R) are to be formed is placed for irradiation with ultraviolet rays having a wavelength of, for example, 365 nm.

In the second embodiment, the width of a region surrounded by the G filters 13G is 8.9 μm and an area of this region which is at a given distance from the edges of the G filters 13G is irradiated with ultraviolet rays. Specifically, ultraviolet irradiation is performed on a 8.4 μm square region which is 0.25 μm inside from the edges of the G filters 13G, where the R filter 13R does not overlap the G filters 13G even when the mask is mispositioned in forming the R filter 13R.

Figure 3C:
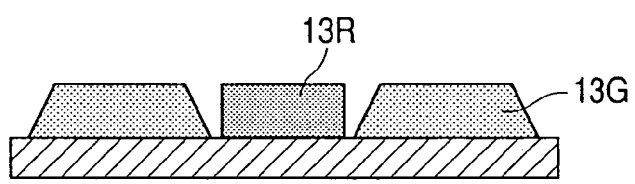
Figure 3D:
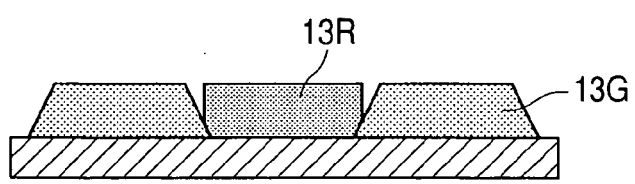
Figure 3E:
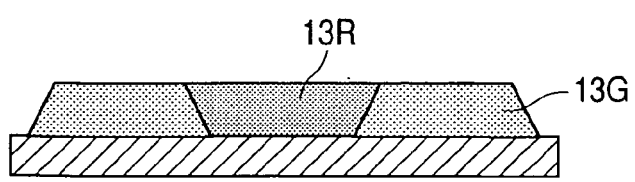

If the ultraviolet irradiation energy is small during formation of the R filter 13R, the R filter 13R after development is isolated like an island in the region surrounded by the G filters 13G as shown in FIG. 3C. If the ultraviolet irradiation energy is increased, the R filter 13R is gradually widened in response to an increase in irradiation energy until the R filter 13R comes into contact with the edges of the G filters 13G as shown in FIG. 3D. As the ultraviolet irradiation energy is further increased, the R filter 13R is increased in size until the region surrounded by the G filters 13G is filled with the R filter 13R. The R filter 13R is almost completely embedded in the region surrounded by the G filters as shown in FIG. 3E if the irradiation energy is optimized. The edges of the R filter 13R are tapered in a manner reverse to how the G filters 13G are tapered as shown in FIG. 3E, thereby adapting the shape of the R filter 13R to the shape of the G filters 13G.

In this embodiment, with the edges of the G filters 13G tapered, a void or other defect hardly takes place in the formation of the R filter 13R in the portion where the R filter 13R is embedded even when the edges of the G filters 13G are locally deformed. The overlapping amount of tapered portions of adjacent color filters is desirably 0.1 μm or more in order to prevent transmission of light from a void without fail.

The edges of each color filter are tapered in this embodiment. Therefore no void is created in the juncture between adjacent color filters.

Accordingly, if this embodiment is applied to a process of manufacturing color filters of a solid state image pickup element by split exposure, voids between adjacent color filters in one exposure region can be kept approximately identical to voids in the other exposure region even when the process fluctuates from one exposure shot to another.

Figure 4A:
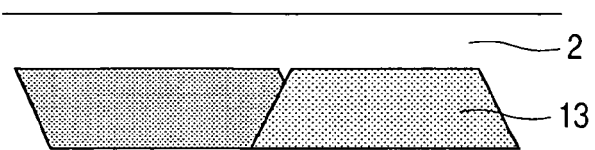
FIGS. 4A and 4B are diagrams of a relevant part enlarged to illustrate an example of the shape of color filters in the solid state image pickup element shown in FIGS. 3A, 3B, 3C, 3D and 3E.
Figure 4B:
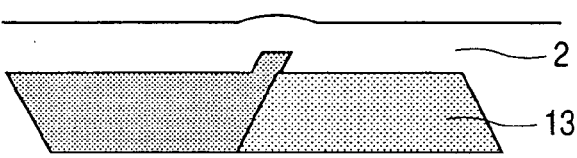

If the ultraviolet irradiation energy is not enough during formation of the R filter 13R in this embodiment, a small void is created on the top faces of the color filters at the edges as shown in FIG. 4A. On the other hand, if the ultraviolet irradiation energy is higher than necessary in forming the R filter 13R, a slight overlapping takes place on the top faces of the color filters at the edges as shown in FIG. 4B. However, these structures shown in FIGS. 4A and 4B can also prevent the ingress of light from a void between adjacent color filters 13, thereby reducing surface irregularities of a second planarization film 2 that is formed on the color filters 13. Accordingly, the amount of incident light that reaches the photoelectric conversion portion does not fluctuate among pixels.

Figure 5A:
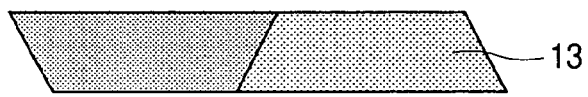
FIGS. 5A, 5B, and 5C are diagrams of a relevant part enlarged to illustrate another example of the shape of color filters in the solid state image pickup element shown in FIGS. 3A 3B, 3C, 3D and 3E.
Figure 5B:
Figure 5C:

It is not necessary for the color filters 13 in this embodiment to have tapered or reversely tapered edges shown in FIG. 5A. The edges of the color filters 13 can have any shape as long as adjacent color filters are fitted to each other, and may be wedgelike as shown in FIGS. 5B and 5C. These shapes can be obtained by changing the exposure contrast at the edges of a region of color resist to be exposed to light.

Third Embodiment

FIGS. 6A to 6E are sectional views showing a manufacture procedure in a third embodiment of a solid state image pickup element of the present invention.

The solid state image pickup element shown in FIGS. 6A to 6E, similarly to the first embodiment, has a pixel pitch of 9 μm and color filters are arranged in accordance with the Bayer pattern.

Figure 6A:
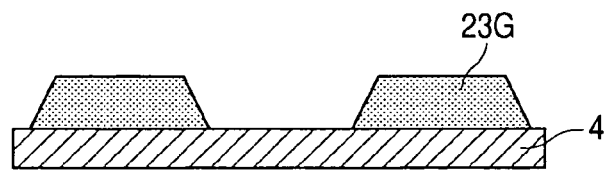
FIGS. 6A, 6B, 6C, 6D, and 6E are sectional views showing a manufacture procedure in a third embodiment of a solid state image pickup element of the present invention.

In a solid state image pickup element manufacturing method of the third embodiment, similarly to the first embodiment, the first step is to apply negative color resist with, for example, a green (G) pigment dispersed therein to a surface of a first planarization film 4. Then a mask which blocks light except where G filters 23G are to be formed is placed for irradiation with ultraviolet rays having a wavelength of, for example, 365 nm, and for subsequent development. Thus G filters 23G are formed on the first planarization film 4 as shown in FIG. 6A. In this embodiment, the G filters 23G are exposed to light through ultraviolet irradiation of varying intensity. To elaborate, the exposure contrast is lowered at edges of a region to be exposed to light, so that the pattern of the G filters 23G measures 9.1 μm at the bottom portion (on the first planarization film 4 side). In this case, the edges of the G filters 23G are tapered as shown in FIG. 6A. The exposure contrast at the edges of the exposure region can be lowered by shifting the focus of exposure light.

Figure 6B:
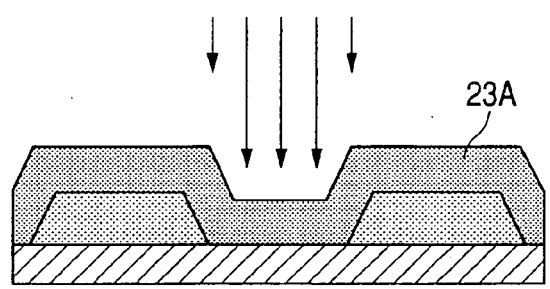

Next, as shown in FIG. 6B, negative color resist 23A with a red (R) pigment dispersed therein is applied to the entire top surface of the first planarization film 4 while covering the G filters 23G. Then a mask which blocks light except where R filters (each denoted by 23R) are to be formed is placed for irradiation with ultraviolet rays having a wavelength of, for example, 365 nm.

Similar to the second embodiment, the width of a region surrounded by the G filters 23G is 8.9 μm and, in the third embodiment, the region surrounded by the G filters 23G is exposed to light through ultraviolet irradiation of varying intensity (See FIG. 6B). To elaborate, the R filter 23R is formed by ultraviolet irradiation with the exposure contrast lowered at the edges of the region to be exposed to light.

Figure 6C:
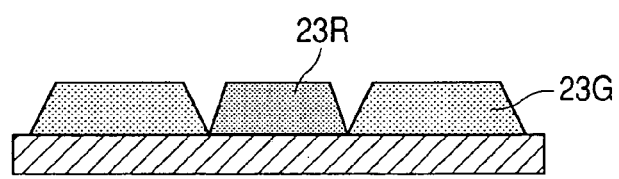

If the ultraviolet irradiation energy is small during formation of the R filter 23R, the R filter 23R after development is isolated like an island in the region surrounded by the G filters 23G as shown in FIG. 6C.

Figure 6D:
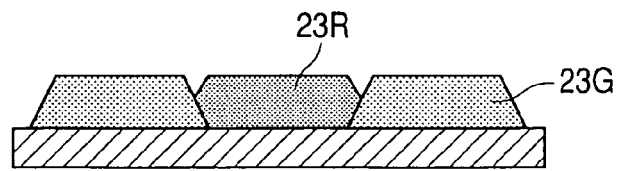

On the other hand, if the ultraviolet irradiation energy is increased, the R filter 23R is gradually widened in response to an increase in irradiation energy until the R filter 23 R comes into contact with the edges of the G filters 23G as shown in FIG. 6D. As the ultraviolet irradiation energy is further increased, the R filter pattern is increased in size until the region surrounded by the G filters 23G is filled with the R filter 23R.

Figure 6E:
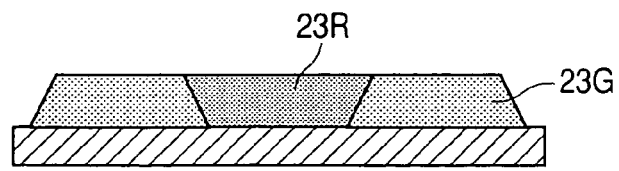

Accordingly, the R filter 23R is almost completely embedded in the region surrounded by the G filters 23G as shown in FIG. 6E if the irradiation energy is optimized.

The edges of each color filter 23 are tapered in this embodiment, similarly to the second embodiment. Therefore no void is created in the juncture between adjacent color filters.

Accordingly, if this embodiment is applied to a process of manufacturing color filters of a solid state image pickup element by split exposure, voids between adjacent color filters in one exposure region can be kept approximately identical to voids in the other exposure region even when the process fluctuates from one exposure shot to another.

The second and third embodiments described above employ a method of shifting the focus of exposure light from the mask surface to lower the exposure contrast at edges of an exposure region. Alternatively, the exposure contrast at edges of an exposure region may be lowered by changing the transmittance in edges of a mask in stages (by gradating the optical density) and this method too can provide excellent results.

Examples of forming R filters after formation of G filters are described in the first through third embodiments. However, the order of forming color filters is not limited thereto and G filters, R filters, and blue color filters (hereinafter referred to as B filters) can be formed in an arbitrary order. In such case, one of the methods by which R filters are formed in the first through third embodiments is employed to form two color filters that are to be formed later.

Fourth Embodiment

Figure 7A:
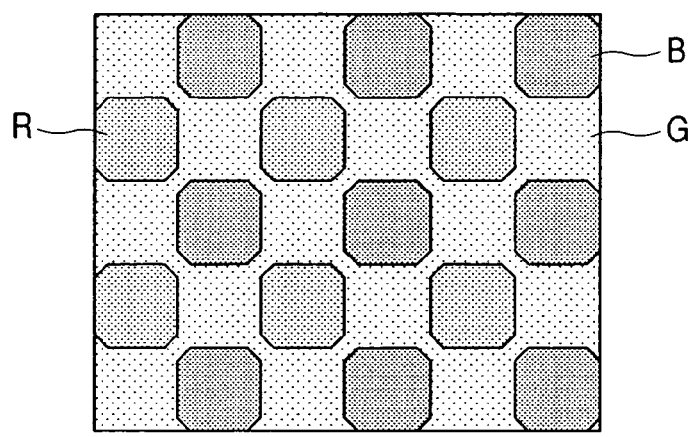
FIGS. 7A, 7B, and 7C are top views showing the structure of a solid state image pickup element according to a fourth embodiment of the present invention.
Figure 7B:
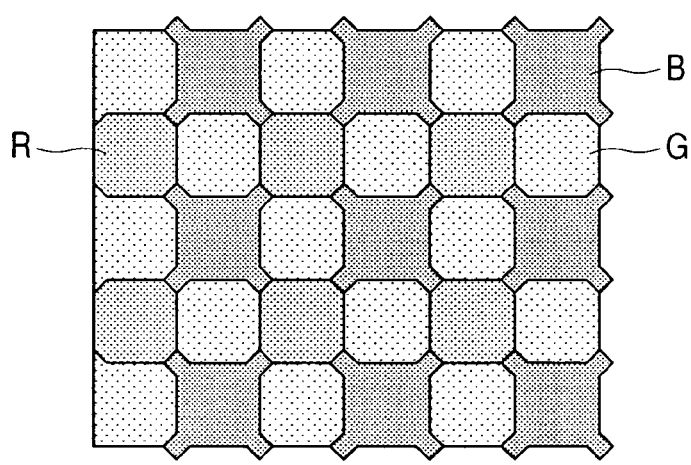
Figure 7C:
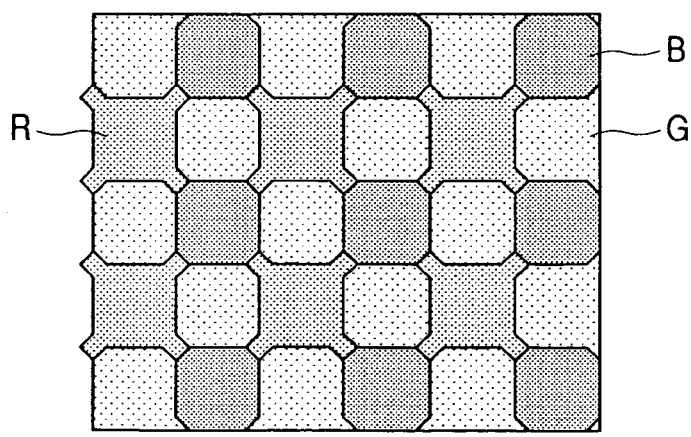

FIGS. 7A to 7C are top views showing the structure of a solid state image pickup element according to a fourth embodiment of the present invention.

As shown in FIG. 2, the exposure contrast is lower in corners of a color filter than along sides of the color filter and therefore the pattern shape is likely to vary around color filter corners due to fluctuation in production process.

This embodiment eliminates a void by filling color filter corners where the exposure contrast is low with one of two adjacent color filters as shown in FIGS. 7A to 7C.

To eliminate a void in a corner of a color filter, color resist is exposed to light using a mask with a transmissive portion of which each corner has a minute pattern for filling a void.

Image non-uniformity between exposure regions in a picked-up image due to void fluctuation among color filter corners can be reduced by thus filling a corner of a color filter with an adjacent color filter. If the fourth embodiment is combined with one of the manufacture methods of the first through third embodiments, voids between color filters are completely eliminated and therefore image non-uniformity between exposure regions in a picked-up image can be reduced even more than in the first through third embodiments.

FIG. 7A shows an example in which G filters are formed in corners of every color filter. FIG. 7B shows an example in which B filters are formed in corners of every color filter. FIG. 7C shows an example in which R filters are formed in corners of every color filter.

Examples of a practical mode of the present invention are listed below.

[Practical Mode 1]

A method of manufacturing a solid state image pickup element with color filters of plural colors formed of negative type color resist, including:

applying negative type color resist for forming first color filters onto an entire surface of a given film;

forming the first color filters by irradiation of given portions with exposure light and by subsequent development;

applying negative type color resist for forming second color filters onto the entire surface of the first color filters while covering the first color filters; and forming the second color filters by irradiating an area smaller than a region that is surrounded by the first color filters with exposure light and by subsequent development.

[Practical Mode 2]

The method of manufacturing a solid state image pickup element as described in practical mode 1, in which the region to be exposed to light during formation of the second color filters is overexposed at edges compared to standard exposure conditions.

[Practical Mode 3]

The method of manufacturing a solid state image pickup element as described in practical mode 1, in which, compared to standard exposure conditions, an exposure contrast is low at any of edges of a region to be exposed to light during formation of the first color filters and edges of a region to be exposed to light during formation of the second color filters.

[Practical Mode 4]

The method of manufacturing a solid state image pickup element as described in practical mode 2 or 3, in which, compared to standard exposure conditions, an focus point of the exposure light is shifted at any of the edges of the region to be exposed to light during formation of the first color filters and the edges of the region to be exposed to light during formation of the second color filters.

[Practical Mode 5]

The method of manufacturing a solid state image pickup element as described in any one of practical modes 2 to 4, in which an optical density of the exposure light is gradated at any of the edges of the region to be exposed to light during formation of the first color filters and the edges of the region to be exposed to light during formation of the second color filters.

[Practical Mode 6]

A solid state image pickup element with color filters of plural colors, in which one of adjacent color filters is tapered at edges while the other color filter is reversely tapered at the edges, allowing the adjacent color filters to fit to each other.

[Practical Mode 7]

A solid state image pickup element with color filters of plural colors, in which adjacent color filters are wedged at edges, allowing the adjacent color filters to fit to each other.

[Practical Mode 8]

The solid state image pickup element as described in practical mode 6 or 7, in which at least one of the adjacent color filters is formed in corners of the adjacent color filters.

[Practical Mode 9]

The solid state image pickup element as described in any one of practical modes 6 to 8, in which the overlapping amount of the adjacent color filters is 0.1 μm or more.

The present invention is constructed as described above, and has the following advantages.

A color filter can be formed stably with its size and position regulated by the sizes of adjacent color filters and no void is created even when there is fluctuation in production process and alignment fluctuation.

If this embodiment is applied to a process of manufacturing color filters of a solid state image pickup element by split exposure, voids between adjacent color filters in one exposure region can be kept approximately identical to voids in the other exposure region even when the process fluctuates from one exposure shot to another. Therefore, image non-uniformity between exposure regions in a picked-up image can be reduced.

What is claimed is:

1. A method of manufacturing a solid state image pickup element with color filters of plural colors formed of color resist of negative type, comprising:
    applying color resist of negative type for forming first color filters onto an entire surface of a given film;
    forming the first color filters by irradiation of given portions with exposure light and by subsequent development;
    applying color resist for forming second color filters onto the entire surface of the first color filters while covering the first color filters; and
    forming the second color filters by exposure to light and subsequent development of an area smaller than a region that is surrounded by the first color filters.

2. A method of manufacturing a solid state image pickup element according to claim 1, wherein the region to be exposed to light during formation of the second color filters is overexposed at edges compared to standard exposure conditions.

3. A method of manufacturing a solid state image pickup element according to claim 1, wherein, compared to standard exposure conditions, an exposure contrast is low at any of edges of the region to be exposed to light during formation of the first color filters and edges of the region to be exposed to light during formation of the second color filters.

4. A method of manufacturing a solid state image pickup element according to claim 1, wherein, compared to standard exposure conditions, a focus point of the exposure light is shifted at any of edges of the region to be exposed to light during formation of the first color filters and edges of the region to be exposed to light during formation of the second color filters.

5. A method of manufacturing a solid state image pickup element according to claim 1, wherein an optical density of the exposure light is gradated at any of edges of the region to be exposed to light during formation of the first color filters and edges of the region to be exposed to light during formation of the second color filters.

* * * * *